(12) United States Patent
Watanabe et al.

(10) Patent No.: US 9,293,293 B2
(45) Date of Patent: Mar. 22, 2016

(54) ELECTRON GUN AND CHARGED PARTICLE BEAM DEVICE HAVING AN APERTURE WITH FLARE-SUPPRESSING COATING

(75) Inventors: Shun-ichi Watanabe, Tokyo (JP); Takashi Onishi, Tokyo (JP); Yoichi Ose, Tokyo (JP); Kuniyasu Nakamura, Tokyo (JP); Masaru Moriyama, Tokyo (JP); Tomonori Suzuki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/240,333

(22) PCT Filed: May 22, 2012

(86) PCT No.: PCT/JP2012/063017
§ 371 (c)(1),
(2), (4) Date: Feb. 21, 2014

(87) PCT Pub. No.: WO2013/027448
PCT Pub. Date: Feb. 28, 2013

(65) Prior Publication Data
US 2014/0197336 A1 Jul. 17, 2014

(30) Foreign Application Priority Data
Aug. 22, 2011 (JP) ................. 2011-180851

(51) Int. Cl.
*A61N 5/00* (2006.01)
*H01J 37/065* (2006.01)

(52) U.S. Cl.
CPC ....... *H01J 37/065* (2013.01); *H01J 2237/0206* (2013.01); *H01J 2237/026* (2013.01); *H01J 2237/0213* (2013.01); *H01J 2237/045* (2013.01); *H01J 2237/06316* (2013.01)

(58) Field of Classification Search
CPC ................. H01J 1/00; H01J 1/02; H01J 1/32; H01J 1/35
USPC ......... 250/492.1, 492.2, 492.3, 306, 307, 311
See application file for complete search history.

(56) References Cited

U.S. PATENT DOCUMENTS 8,426,835 B2* 4/2013 Kasuya et al. ............. 250/515.1
2004/0232823 A1* 11/2004 Nakata et al. ................. 313/495
(Continued)

FOREIGN PATENT DOCUMENTS

JP   09-204891 A    8/1997
JP   2007-250491 A  9/2007
(Continued)

OTHER PUBLICATIONS

International Search Report issued in International Application No. PCT/JP2012/063017 with Date of mailing Jul. 10, 2012, with English Translation.

*Primary Examiner* — Jack Berman
*Assistant Examiner* — Jason McCormack
(74) *Attorney, Agent, or Firm* — McDermott Will & Emery LLP (57) ABSTRACT

The objective of the present application is to suppress the occurrence of flares and to reduce the amount of secondary electrons arising at an aperture provided to the lead-out electrode of an electron gun. By coating a thin film having a low rate of secondary electron emission such as carbon onto the aperture of a lead-out electrode closest to an electron source in an electron gun, it is possible to reduce the amount of secondary electrons arising. Secondary electrons arising at the lead-out electrode, are reduced, and so as a result, flare is reduced. By incorporating two apertures to the lead-out electrode, and applying to the two apertures a potential that is equipotential to the lead-out electrode, it is possible to eliminate an electric field from seeping from under to over the lead-out electrode. Secondary electrons arising when an electron beam impacts the lead-out electrode cease to incur force in the direction of passage from the lead-out electrode, and consequently there is a reduction in flares.

11 Claims, 8 Drawing Sheets

(56) References Cited

U.S. PATENT DOCUMENTS

2007/0057617 A1* 3/2007 Coyle et al. .................. 313/446
2008/0048117 A1 2/2008 Suzuki
2008/0121811 A1* 5/2008 Horsky et al. ................ 250/424
2011/0227173 A1* 9/2011 Seppala et al. ............... 257/415

FOREIGN PATENT DOCUMENTS

| JP | 2008-052935 A | 3/2008 |
| JP | 2008-117662 A | 5/2008 |
| JP | 2009-037966 A | 2/2009 |
| WO | WO 2010146833 A1 * | 12/2010 |

* cited by examiner

ELECTRON GUN AND CHARGED PARTICLE BEAM DEVICE HAVING AN APERTURE WITH FLARE-SUPPRESSING COATING

RELATED APPLICATIONS

This application is the National Phase under 35 U.S.C. §371 of International Application No. PCT/JP2012/063017, filed on May 22, 2012, which in turn claims the benfit of Japanese Application No. 2011-180851, filed on Aug. 22, 2011, the disclosures of which Application is incorporated by reference herein.

TECHNICAL FIELD

The present invention relates to an electron gun including a Schottky electron source or a field emission electron source and a charged particle beam device equipped with these electron guns.

BACKGROUND ART

Since the Schottky electron gun and the field emission electron gun can stably emit an electric current of high brightness in a narrow energy spread, these electron guns are used for the electron gun of a charged particle beam device such as a scanning electron microscope (SEM) and a transmission electron microscope (TEM). Particularly, these electron guns are used for the electron gun of an electron microscope for analysis because of the characteristics of a narrow energy spread and a high brightness, for example.

Figure 3:
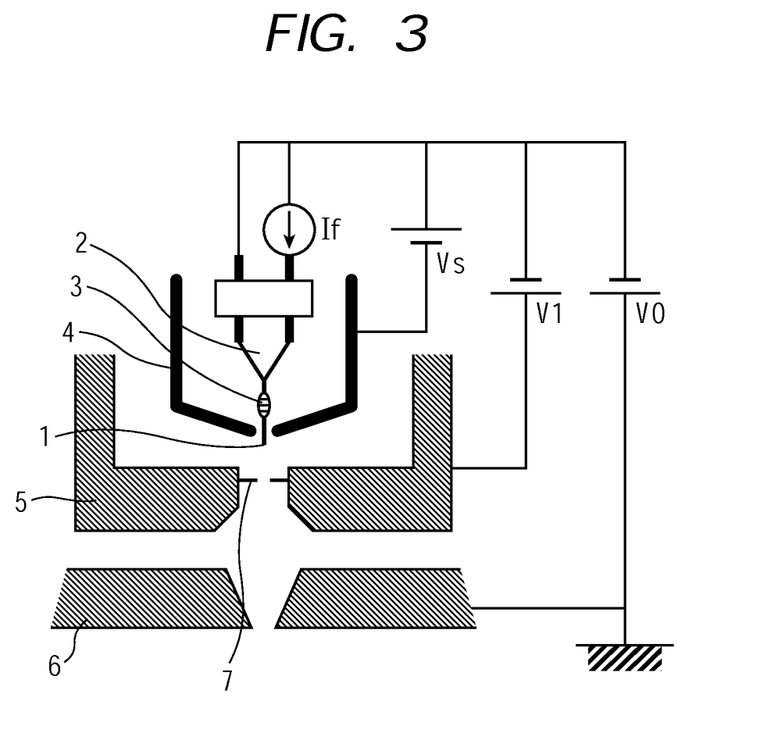
FIG. 3 is a schematic diagram of an exemplary previously existing Schottky electron gun.

FIG. 3 schematically illustrates the configuration of a previously existing electron gun as a Schottky electron gun is taken as an example. The electron gun is configured of at least components below, including an electron source 1 formed of a tungsten single crystal material with a sharpened tip end, a filament 2 welded to the electron source 1 for heating the electron source 1, zirconium dioxide 3 coated over the electron source 1, a suppressor electrode 4 that suppresses thermoelectrons generated from the filament 2, an extracting electrode 5 that provides a strong electric field at the tip end of the electron source 1 for extracting electrons, and one or a plurality of accelerating electrodes 6 that accelerate the extracted electrons to a predetermined energy. The electron gun in FIG. 3 is the case of including one stage of the accelerating electrode. Moreover, the extracting electrode 5 includes an aperture 7 that restricts electrons (an electron beam) passed therethrough.

A negative potential V0 is applied to the electron source 1 with respect to the ground potential. When an electric current is passed through the filament 2, the filament 2 is heated at a temperature of about 1,800 K, and the zirconium dioxide 3 coated over the electron source 1 is diffused toward the tip end of the electron source 1. At this time, the work function on the tip end face of the electron source 1, that is, the work function on the crystal plane (100) of a single crystal is reduced to about 2.8 eV. Here, when a positive voltage V1 is applied to the extracting electrode 5 with respect to the electron source 1, the electric field near the tip end of the electron source 1 is increased, and electrons (an electron beam) are emitted from the crystal plane of the electron source 1, on which the work function is reduced, toward the extracting electrode 5 by Schottky effect (technically, electrons are emitted from crystal planes of tetragonal symmetry orthogonal to the crystal plane (100) such as the crystal plane (101) and the crystal plane (001) on the side faces near the tip end of the electron source in addition to the crystal plane (100) of the tip end of the electron source).

In the electrons emitted from the electron source 1, the electrons passed through the extracting electrode 5 are accelerated at a predetermined accelerating voltage by the accelerating electrode 6, and emitted from the electron gun. The electrons emitted from the electron gun are reduced to a specific magnification by a condenser lens and an objective lens, for example, not illustrated, and applied to a sample.

The electron microscope detects secondary electrons, transmission electrons, and reflection electrons generated by an interaction between electrons and a sample when the electrons collide against the sample, and observes and analyzes the microstructure of the sample.

Here, when an electron beam spot is observed through a fluorescent screen, for example, brightness called a flare is sometimes confirmed around a main beam.

Figure 4:
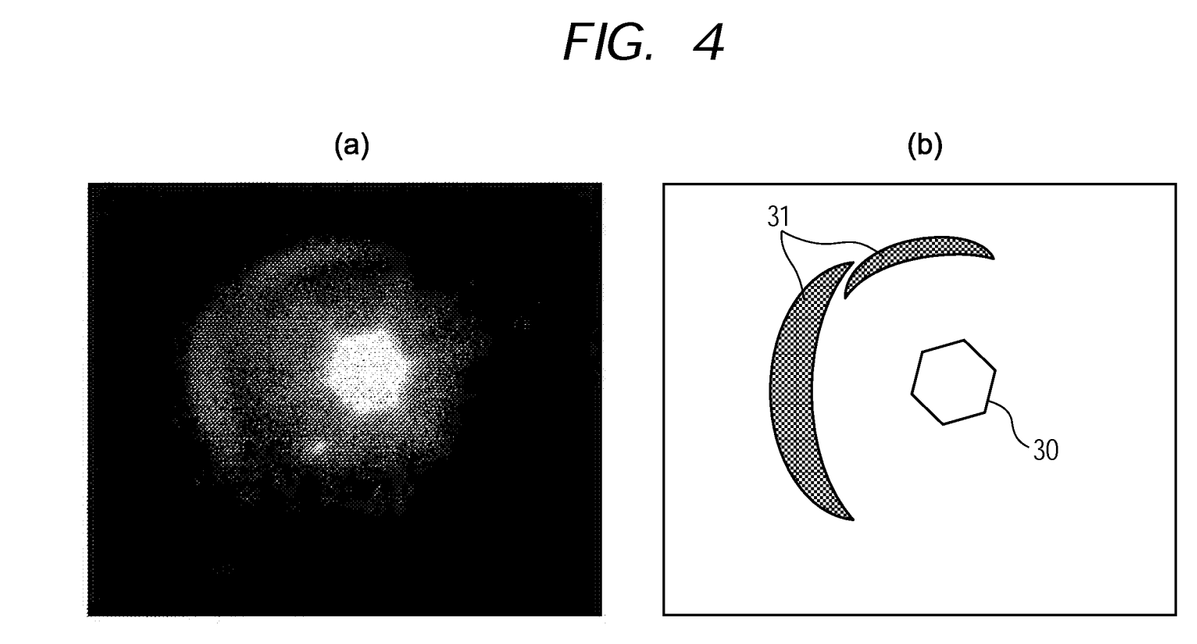
FIG. 4 is an exemplary flare image observed on an electron microscope, (a) is a photograph diagram of the flare image, and (b) is a schematic diagram.

FIG. 4 is a main beam 30 and a flare 31 of an electron beam spot actually observed. FIG. 4(a) is a photograph diagram and FIG. 4(b) is a schematic diagram. The flare 31 causes a reduction in signal-to-noise and a reduction in resolution of the observed image of the electron microscope and causes a system peak when analyzed.

Figure 5:
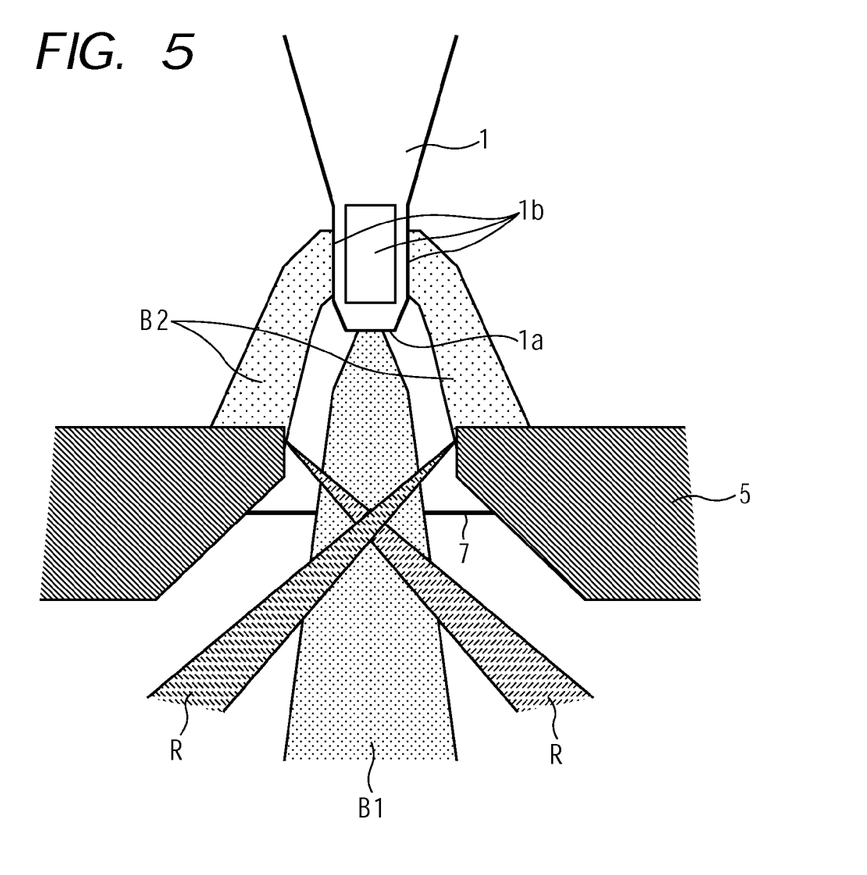
FIG. 5 is a schematic diagram of a cause in which a flare occurs in a previously existing technique.
Figure 6:
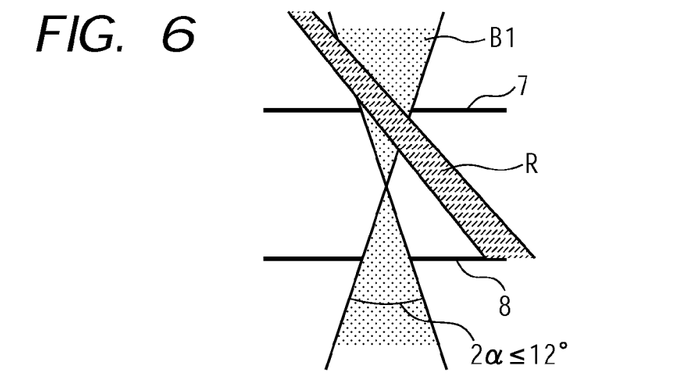
FIG. 6 is a schematic diagram of the previously existing technique in which the reflection electrons of electrons emitted from the side faces of an electron source are restricted using an extracting electrode.

As illustrated in FIG. 5, in Related Patent Document 1, it is considered that the flare is caused by electrons (an electron beam R) that an electron beam B2 emitted from crystal planes 1b (the crystal plane (010) and the crystal plane (001), for example) on the side faces near the tip end of an electron source (a tungsten single crystal) 1 is reflected in an extracting electrode 5. In this connection, a main beam B1 is emitted from a tip end face 1a of the electron source 1 (i.e. the crystal plane (100)). In Related Patent Document 1 (Japanese Patent Application Laid-Open Publication No. 2008-117662), for the measures against the flare, a plurality of apertures 7 and 8 (two apertures, for example) were provided on an electron beam passage to geometrically restrict an angle at which the electrons are passed, as illustrated in FIG. 6. As a result, the reflection electron beam R from the extracting electrode caused by the electron beam emitted from the tip end side faces of the electron source 1 is geometrically restricted. Here, in the case where the apertures 7 and 8 are mounted on the extracting electrode 5, the apertures 7 and 8 restrict an angle of the electrons passed to an angle of 6°.

CITATION LIST

Patent Literature

PATENT DOCUMENT 1: Japanese Patent Application Laid-Open Publication No. 2008-117662

SUMMARY OF THE INVENTION

Technical Problem

In the electron gun, a flare also occurs from causes other than the reflection electrons R from the side faces of the extracting electrode. This is because it is confirmed by experiment that a flare includes a component having energy a few kV lower than the energy of the main beam and this component occurs from a cause other than the reflection electron. In the electrons emitted from the electron source 1, the electrons passed through the extracting electrode 5 are 1/100 or less, and most of the electrons collide against the extracting electrode 5 and the aperture 7. For example, the entire electric current emitted from the electron source ranges from a few to a few hundreds microamperes, whereas the electric current passed through the aperture 7 mounted on the extracting electrode 5 ranges from a few tens to a few hundreds nanoamperes.

Figure 7:
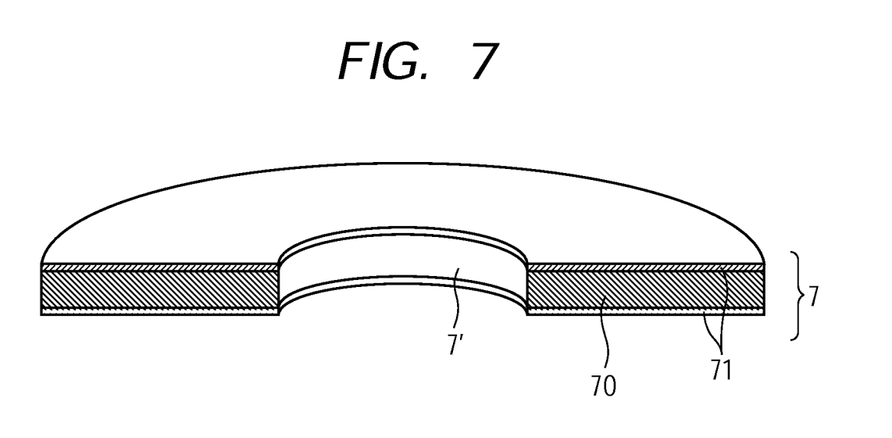
FIG. 7 is a perspective view of a previously existing aperture mounted on the extracting electrode, which is cut in a half.
Figure 8:
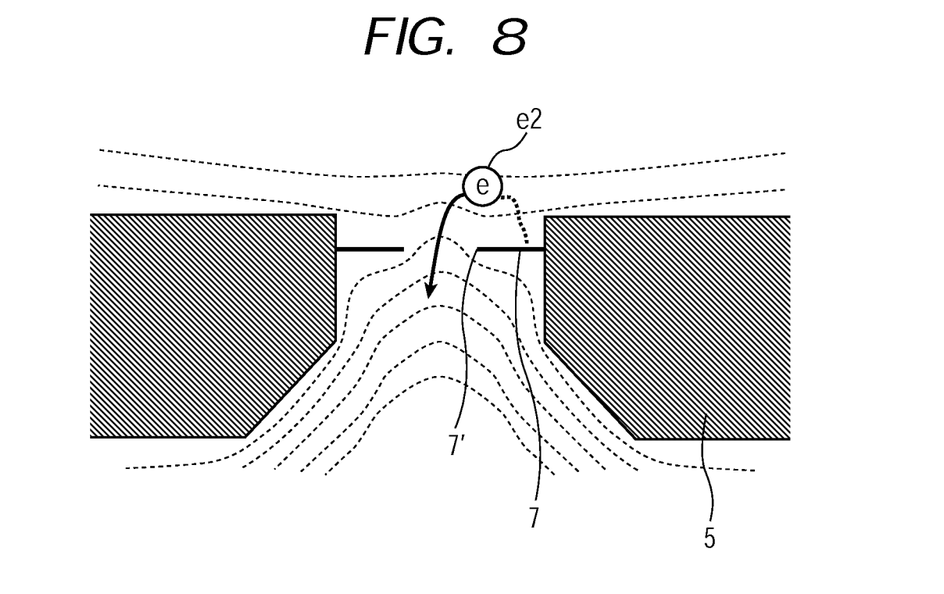
FIG. 8 is a conceptual diagram of a manner in which a secondary electron generated at the aperture mounted on the extracting electrode is passed through the aperture in the previously existing technique.

FIG. 7 is the detail of a previously existing aperture 7 mounted on an extracting electrode 5. 7' denotes a beam transmission hole of the aperture 7. A plate 70 forming the aperture 7 is made of molybdenum in a thickness of 10 to 50 μm, and the surface of the molybdenum plate 70 is coated with platinum palladium 71 in a thickness of 10 to 50 nm in order to prevent electrification caused by an oxidize film. When electrons collide against the aperture 7 provided on the extracting electrode 5, the interaction between the electrons and the platinum palladium generates a secondary electron e2 (see FIG. 8). In addition to this, as illustrated in FIG. 8, an electric field generated by the extracting electrode 5 and an accelerating electrode 6 goes beyond the aperture 7 mounted on the extracting electrode 5 (see FIG. 3). This electric field applies force to the secondary electron e2 generated at the aperture 7 in the direction in which the secondary electron e2 is passed through the aperture 7 (the hole 7'). The secondary electron e2 passed through the aperture 7 is further accelerated, and emitted from the electron gun. The electron beam of the secondary electron e2 generated at the aperture 7 is observed as a spatially spread flare of low energy on the electron microscope as compared with the main beam of primary electrons directly emitted from the electron source 1. The flare causes a reduction in resolution, a reduction in signal-to-noise, and a system peak when analyzed.

Related Patent Document 1 discloses neither the recognition of the problems of the secondary electrons generated at the aperture 7 nor a means for solving the problems.

The present invention is made in the circumstances of the problems. It is an object of the present invention to reduce an amount of secondary electrons generated at an aperture provided on an extracting electrode and to suppress the occurrence of a flare.

Solution to Problem

In order to solve the problems, the present invention is basically configured as follows.

(1) Namely, an electron gun includes: an electron source; an extracting electrode configured to apply an electric field to the electron source for extracting electrons from the electron source, the extracting electrode including an aperture configured to pass a part of electrons from the electron source; and an accelerating electrode configured to accelerate electrons extracted using the extracting electrode at a predetermined accelerating voltage. In the electron gun, one or more of the apertures are provided, and a surface of a base material of at least an aperture closest to the electron source is coated with a material having a secondary electron emission rate of 0.6 or less when irradiation energy of primary electrons colliding against the aperture ranges from 2 to 3 kV, as a material having a small secondary electron emission rate.

Preferably, the coating material applied to the surface of the base material of the aperture is carbon or boron, for example.

Preferably, the electron gun is applied to a Schottky electron gun or a field emission electron gun as an application object, but not limited thereto. The electron gun is applicable to other electron guns including similar problems.

(2) Moreover, in addition to the configuration described above, the invention of the present application also proposes an electron gun in which the extracting electrode is provided with two upper and lower apertures; and a potential of these apertures is made equal to a potential of the extracting electrode.

As illustrated in the configuration in (1), the material on the surface of the base material of the aperture 7 provided on the extracting electrode 5 is changed to a material of a low secondary electron emission rate, so that it is possible to reduce an amount of secondary electrons generated from the surface of the base material of the aperture because a primary electron beam (an electron beam emitted from the electron source) collides against the aperture 7.

Furthermore, the potential of the two upper and lower apertures provided on the extracting electrode as in (2) is controlled to be equal to the potential of the extracting electrode, so that it is possible to eliminate an electric field going from below to above the extracting electrode. Accordingly, even though secondary electrons are generated (emitted) from the surface of the base material of the aperture valve, it is possible to prevent the secondary electrons being passed through the aperture.

Advantageous Effects of the Invention

According to the present invention, it is possible to reduce an amount of secondary electrons generated at an aperture provided on an extracting electrode. Accordingly, the occurrence of a flare is suppressed, so that it is possible to observe an image of a high resolution and a high signal-to-noise when observing a sample using an electron microscope, for example. Moreover, a system peak when analyzed is eliminated as well.

Furthermore, in addition to the foregoing configurations, the technique that controls the potential of the two upper and lower apertures to be equal to the potential of the extracting electrode is selectively adopted, so that even though secondary electrons are generated as described above, the secondary electrons are prevented from being passed through the aperture, and it is possible to more effectively prevent the occurrence of a flare caused by the secondary electrons.

DESCRIPTION OF EMBODIMENTS

Embodiments of the present invention will be described with reference to embodiments in FIGS. 1, 2, and 9 to 13.
First Embodiment An embodiment in FIG. 1 (a first embodiment) is a Schottky electron gun as an example to which the present invention is applied.

Figure 1:
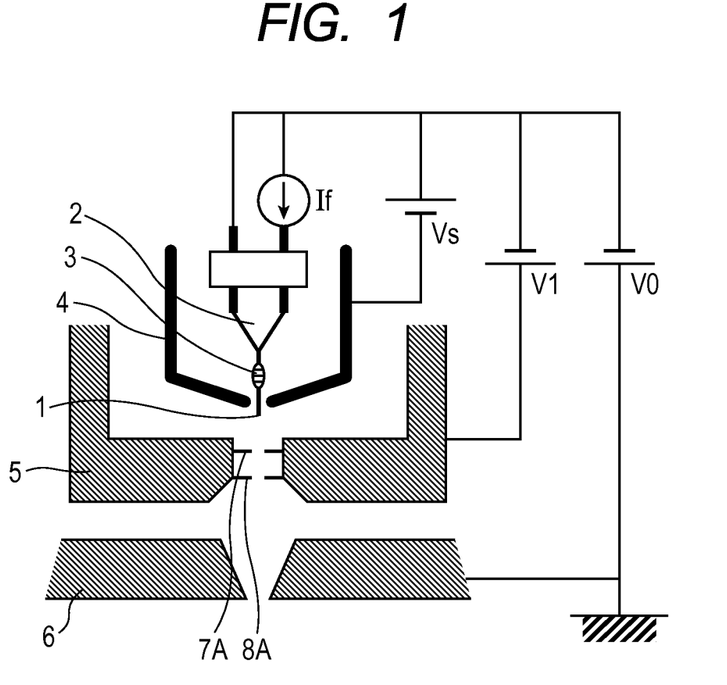
FIG. 1 is a schematic diagram of a first embodiment of a Schottky electron gun to which the present invention is applied.

In the drawing, an electron source (an emitter) 1, a filament 2, zirconium dioxide 3, a suppressor electrode 4, an extracting electrode 5, and an accelerating electrode 6 are similar to the previously existing components illustrated in FIG. 3.

Namely, in driving the electron gun, the electron source 1 made of a tungsten single crystal material is heated at a temperature of about 1,800 K by the filament 2. At this time, the zirconium dioxide 3 coated over the electron source is diffused, and the work function of the crystal plane (100) of the tip end face of the electron source 1 is reduced to about 2.8 eV. Here, when a positive potential of the work function or more is applied to the extracting electrode 5 with respect to the electron source 1, an electric field near the tip end of the electron source 1 is increased, and electrons are emitted from the electron source 1. In the electrons emitted from the electron source 1, the electrons passed through apertures 7A and 8A provided on the extracting electrode 5 are accelerated at a predetermined accelerating voltage at the accelerating electrode 6, and emitted as the electron beam of the electron gun. On the other hand, the electrons that are not enabled to be passed thorough the extracting electrode 5 are mostly absorbed into the extracting electrode 5 when colliding against the extracting electrode 5. According to the previously existing technique, as already described above, a part of the electrons generate secondary electrons and reflection electrons due to the interaction between the aperture members, the extracting electrode, and primary electrons.

In the embodiment, first, the following configuration is provided in order to suppress the generation of these secondary electrons.

Figure 2:
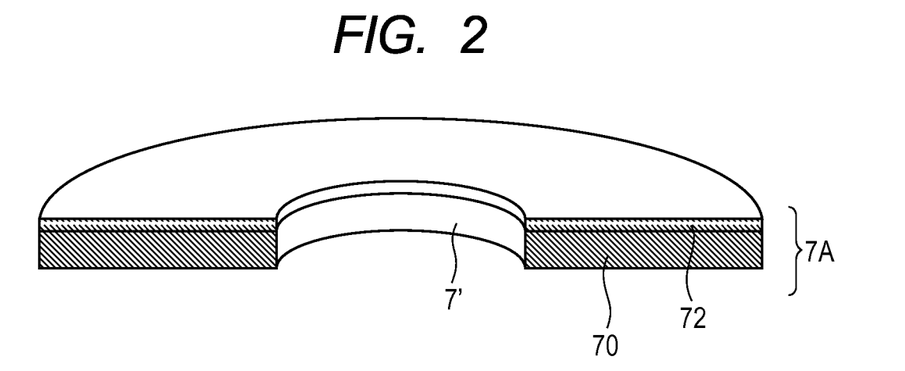
FIG. 2 is a perspective view of an aperture mounted on an extracting electrode according to the embodiment, which is cut in a half.

First, a plurality of apertures, two upper and lower apertures 7A and 8A, for example, are provided on the extracting electrode 5. A material 72 of a small secondary electron emission rate is coated over the surface of a base material (molybdenum, for example) 70 of at least the upper aperture 7A as illustrated in FIG. 2. Carbon and boron are named for a preferable coating 72.

In the case where electrons from the electron source are caused to collide against a target at an electron irradiation energy of 2 to 3 kV, the secondary electron emission rate of carbon ranges from 0.2 to 0.6, and the secondary electron emission rate of platinum ranges from 1.0 to 1.5. The secondary electron emission rates are disclosed in "A DATA BASE ON ELECTRON-SOLID INTERACTIONS, David Joy (URL:rsh.nst.pku.edu.cn/software/database0101.doc)", for example. Therefore, in the case where the carbon film 72 is coated over the surface of the base material 70 of the aperture 7A, secondary electrons emitted from the aperture 7A (namely, secondary electrons generated when primary electrons from the electron source 1 are caused to collide against the aperture 7A) can be reduced to ⅕ to ⅖ as compared with the previously existing aperture 7. The carbon film 72 illustrated in FIG. 2 is applied to at least the top face of the base material 70 of the aperture 7A, that is, applied to the surface to which a primary electron beam from the electron source is applied. The thickness of the carbon film 72 has to be thick in order to prevent the primary electrons emitted from the electron source from being passed through the carbon film 72. However, when the thickness is too thick, the coating is prone to peel off. Desirably, the film thickness of the carbon film 72 is 500 nm or less. A typically preferable film thickness of the coating ranges from 50 to 200 nm.

The carbon film is used as the coating material for the aperture as described above, so that it is possible to reduce an amount of secondary electrons generated at the aperture provided on the extracting electrode. According to the embodiment, when observing a sample through an electron microscope, it was possible to observe an image of a high resolution and a high signal-to-noise by suppressing the occurrence of a flare.

It is noted that for the coating material 72, boron can also achieve a low secondary electron emission rate similar to carbon. The secondary electron emission rate for boron is 0.4 or less in the case where electrons from the electron source are caused to collide against boron at an electron irradiation energy of 2 to 3 kV.

The technical concept of the invention of the present application is basically in that the surface of the base material of the aperture provided on the extracting electrode of the electron gun is coated with a material as a material of a small secondary electron emission rate, which has a secondary electron emission rate of 0.6 or less in the case where the irradiation energy of primary electrons colliding against the aperture ranges from 2 to 3 kV. When the secondary electron emission rate is satisfied, a material other than carbon and boron may be used for the base material applied to the surface of the base material of the aperture.

Moreover, the potential of the two upper and lower apertures, the aperture 7A and the aperture 8A, is the same as the potential of the extracting electrode 5.

Figure 9:
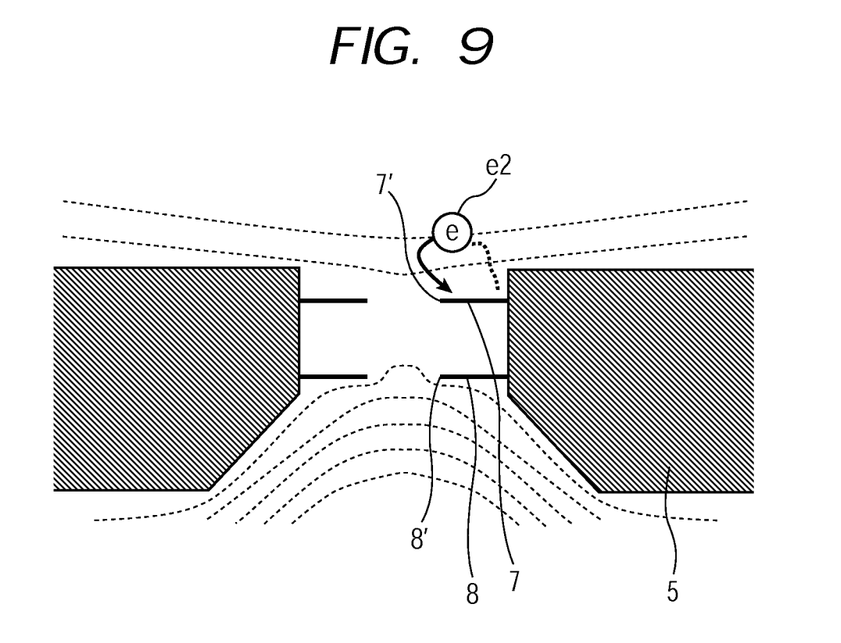
FIG. 9 is a conceptual diagram of the potential distribution near apertures on an extracting electrode when two apertures are provided.

FIG. 9 is a schematic diagram of the potential distribution near the apertures 7A and 8A in this case. In FIG. 9, since the potential in the space between the aperture 7A and the aperture 8A is equal to the potential of the extracting electrode 5, the electric field is zero in the space. Therefore, the electric field generated between the accelerating electrode 6 and the extracting electrode 5 is relaxed in this space, and does not go beyond the aperture 7A. In the embodiment, as already described, the aperture 7A is applied with the coating 72 using a material of a small secondary electron emission rate. Even though an electron beam collides against near the aperture 7A to generate secondary electrons, the electric field generated between the accelerating electrode 6 and the extracting electrode 5 is relaxed in this space, and does not go beyond the aperture 7A. Thus, the secondary electrons are absorbed into the extracting electrode 5 while scattering in the extracting electrode 5, not passed through the aperture 7A.

On the other hand, since the electric field goes beyond the aperture 8A, secondary electrons are generated in the case where the main electron beam (primary electrons) passed through the aperture 7A collides against the aperture 8A. These secondary electrons are passed through the aperture 8A mounted on the extracting electrode 5. In this case, when the aperture 8A is also coated with a material of a small secondary electron generation rate (carbon and boron, for example), the generation of secondary electrons can be effectively suppressed. However, instead of the material, the following structural consideration can also effectively suppress the generation of secondary electrons from the aperture 8A.

Namely, the hole diameter of the aperture 8A is geometrically increased more than that of the aperture 7A in order that the main electrons do not collide against the base material 70 of the aperture 7A. Moreover, desirably, the distance between the two apertures is one time the inner diameter of the aperture 8A or more in order that the electric field does not go beyond the aperture 7A. For example, in the case where the inner diameter of the aperture 7A is 0.5 mm and the distance between the tip end of the electron source 1 and the aperture 7A is 1.5 mm, the inner diameter of the aperture 8A is set to 0.6 mm and the distance between the two apertures 7A and 8A is set to 0.6 mm or more. On the other hand, when the distance between the two apertures 7A and 8A becomes long, the extracting electrode 5 becomes thick, which sometimes causes a problem in that the optical properties of the electron gun are degraded. Therefore, desirably, the distance between the two apertures 7A and 7B is one time to three times the inner diameter of the aperture 8A.

It is noted that in the embodiment, the two apertures 7A and 8A are provided, so that the effect similar to the effect of Related Patent Document 1 (Japanese Patent Application Laid-Open Publication No. 2008-117662) already described, that is, the effect can also be exerted to prevent the transit of the electron beam R reflected in the extracting electrode as illustrated in FIG. 6 in the present specification.

According to the embodiment, the electrons passed through the extracting electrode 5 are accelerated at a predetermined energy at the accelerating electrode 6, and emitted from the electron gun. Since all the emitted electrons are electrons emitted from the electron source 1, no flare occurs in the case where a sample is observed through the electron microscope, and an image of a high resolution and a high signal-to-noise can be obtained. Moreover, it is also possible to eliminate a system peak when analyzed.

Figure 10:
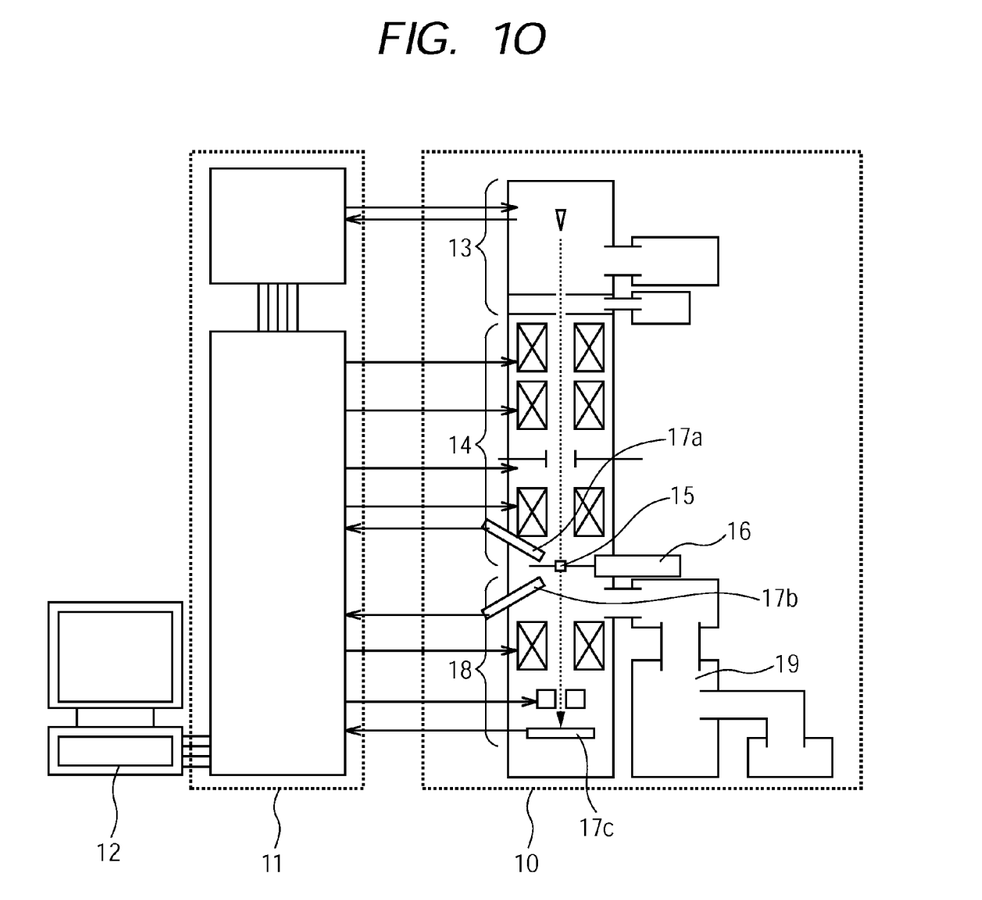
FIG. 10 is a schematic diagram of an electron microscope system mounted with an electron gun according to the present invention.

FIG. 10 is a schematic diagram of a transmission electron microscope (TEM/STEM) system as an exemplary charged particle beam device mounted with the electron gun according to the present invention. The electron microscope is configured of a main body 10 including an electron gun 13 according to the foregoing embodiment, a power supply 11 that supplies a voltage and an electric current to drive the main body, and a controller 12 that controls the main body 10 by controlling the output of the power supply.

In the configuration, the main body 10 is configured of the electron gun 13 that generates and emits electrons accelerated at given energy, an illumination system 14 that controls the emitted electrons toward a sample, a sample stage 16 that holds a sample 15 and moves the sample 15 in a given direction, a secondary electron detector 17a that detects signals when the electrons collide against the sample, a scattering electron detector 17b, detection systems including a transmission electron detection system 17c and other detection systems, an image forming system 18 that controls the magnification and angle of electrons to be passed through the sample, and an exhaust system 19 that vacuum-exhausts the entire system, for example. The power supply 11 includes a voltage supply that supplies a potential to the electrodes of the electron gun 10 and electric current supplies that pass electric currents through the lenses of the illumination system 14 and the image forming system 18, and also includes a power supply that drives the units of the main body 10 and a power supply that drives the controller 12, for example.

The controller 12 serves as controlling the main body 10 by controlling the output of the power supply 11. As for the electron gun, the controller 12 controls the accelerating voltage, the extracting voltage, and the filament current, for example, and controls the electron gun to emit electrons having a given accelerating energy in a given amount. The electron gun 13 includes the aperture 7A and the aperture 8A described in the foregoing embodiment, in which at least the aperture 7A is coated with a material of a small secondary electron emission rate and a potential the same as that of the extracting electrode is applied to the space between the apertures 7A and 8A. It is noted that FIG. 10 is a schematic diagram of the transmission electron microscope (TEM/ATEM). A similar effect can be expected in the electron gun 13 described in the foregoing embodiment even in the case where the electron gun 13 is mounted on a scanning electron microscope (SEM).

Figure 11:
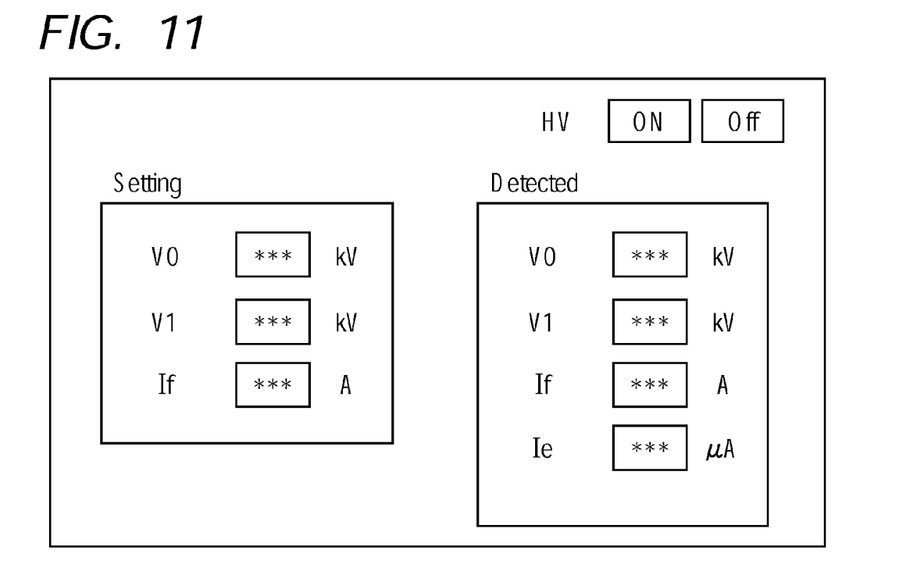
FIG. 11 is a schematic diagram of a control screen for an electron gun displayed on a control PC.

FIG. 11 is an exemplary electron gun control screen displayed on the monitor of the controller. FIG. 11 is a control screen for the Schottky electron gun. Set values are displayed on the left side of the screen, and HV-ON buttons and read values are displayed on the right side. The accelerating voltage (V0), the extracting voltage (V1), and the filament current (If) are preset on the left side of the screen. When the HV-ON button is pressed, a negative accelerating potential (−V0) is applied to the electron source 1. Moreover, an electric current is passed through the filament 2 to heat the electron source 1. When a positive extracting voltage (V1) is applied to the extracting electrode 5 with respect to the electron source after sufficiently heating the electron source 1, electrons are emitted from the electron source 1. Here, an emission current (Ie) detects electrons emitted from the electron source 1 or an electric current caused by electrons absorbed in the extracting electrode 5. The potential of the two apertures 7A and 8A applied to the embodiment is controlled to be equal to the potential of the extracting electrode as already described. In FIG. 11, the accelerating voltage, the extracting voltage, the filament current, and the emission current are displayed as the read values. However, it may be fine that all values are displayed, or necessary values are selected and displayed.

Second Embodiment

Figure 12:
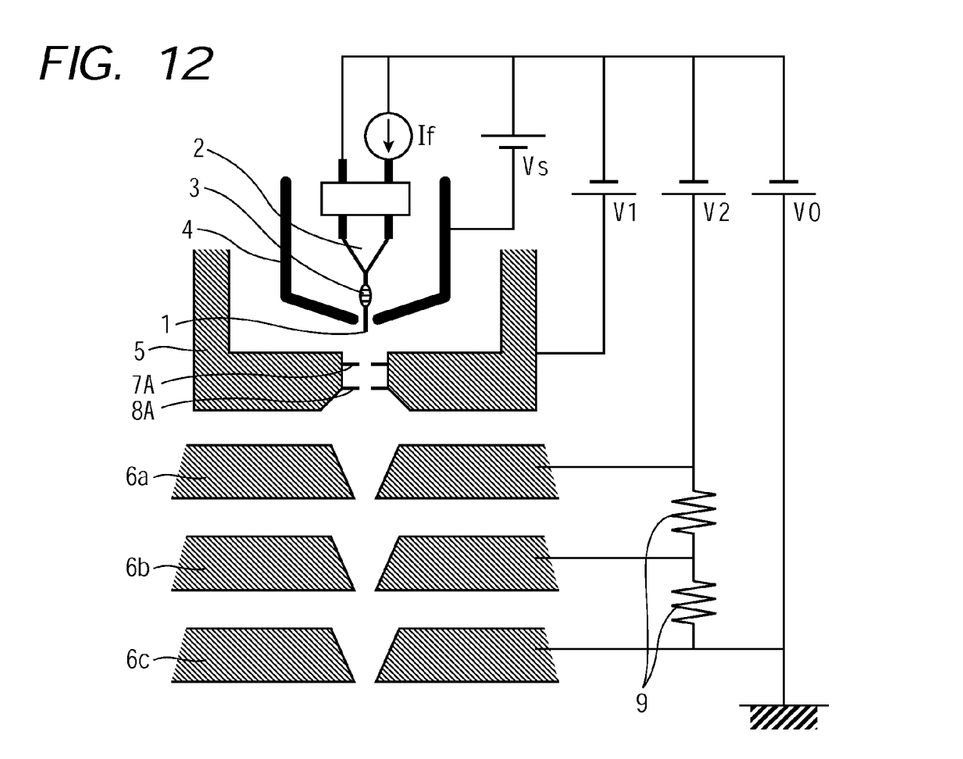
FIG. 12 is a schematic diagram of a second embodiment of the present invention.

FIG. 12 is another embodiment (a second embodiment) including accelerating electrodes in a plurality of stages. Differences between the embodiment and the first embodiment are in that the Schottky electron gun including the accelerating electrode 6 in a single stage is shown in the first embodiment and a Schottky electron gun including accelerating electrodes in three stages is shown in the second embodiment. The configurations of apertures 7A and 8A are similar as in the first embodiment. The basic operations and working effect of the embodiment are similar as in FIG. 1, and the description is omitted.

In the embodiment, a control voltage V2 having a positive potential with respect to an electron source 1 is applied to an accelerating electrode 6a. An accelerating electrode 6c is grounded, and a voltage across the accelerating electrodes 6a and 6b and a voltage across the accelerating electrodes 6b and 6c are divided by a split resister 9 at an equal voltage ((V0−V2)/2). Here, the control voltage V2 is used for controlling the trajectory of electrons when passed through the accelerating electrode 6.

Also as in the embodiment, all of electrons emitted from the electron gun are electrons emitted from the electron source 1. Therefore, in the case where a sample is observed through an electron microscope, no flare occurs, and it is possible to obtain an image of a high resolution and a high signal-to-noise. Moreover, it is also possible to eliminate a system peak when analyzed.

The embodiments illustrated in FIGS. 1 and 12 show the embodiments of the Schottky electron gun. However, the similar effect can be obtained also in the case of a field emission electron gun. Also in the case of the field emission electron gun, a tungsten single crystal is used for an electron source, and an extracting electrode and an accelerating electrode are similarly disposed as in the Schottky electron gun. The extracting electrode is provided with the apertures 7A and 8B similarly in the first and second embodiments already described. As publicly known, the field emission electron gun is different from the Schottky electron gun in that the field emission electron gun is an electron gun using the field emission phenomenon, which is operated at ambient temperature and needs ultrahigh vacuum. The configurations of the apertures 7A and 8A are similar as in the Schottky electron gun, and the drawings are omitted in the embodiment.

In the foregoing embodiments, the example is shown that the two apertures 7A and 8A are provided on the extracting electrode. However, one aperture or three apertures or more may be provided, in which at least the aperture 7A closest to the electron source is coated with a member of a small secondary electron emission rate.

Moreover, the present invention is applicable not only to the electron microscope (TE/STEM/SEM) but also to other charged particle devices.

REFERENCE SIGNS LIST

1 Single crystal tungsten electron source
2 Filament
3 Zirconium dioxide
4 Suppressor electrode
5 Extracting electrode
6, 6a, 6b, 6c Accelerating electrode
7, 8 Aperture
7A, 8A Aperture
70 Base material for the aperture
71 Antistatic coating
72 Coating for reducing an amount of secondary electrons generated
9 Split resister
10 Main body
11 Power supply
12 Controller
13 Electron gun
14 Illumination system
15 Sample
16 Sample stage
17a Secondary electron detector
17b Scattering electron detector
17c Transmission electron detector
18 Image forming system
19 Exhaust system

The invention claimed is:
1. An electron gun comprising:
an electron source;
an extracting electrode configured to apply an electric field to the electron source for extracting electrons from the electron source, the extracting electrode including one or more aperture plates each having an opening configured to pass a part of electrons from the electron source; and
an accelerating electrode configured to accelerate electrons extracted using the extracting electrode at a predetermined accelerating voltage, wherein:
a surface of at least an aperture plate of the extracting electrode closest to the electron source is coated with a material having a secondary electron emission rate of 0.6 or less when irradiation energy of primary electrons colliding against the aperture ranges from 2 to 3 kV, the surface being irradiated with the electrons extracted using the extracting electrode,
a base material of the aperture plate provided on the extracting electrode is thinner than the extracting electrode, and
the coating material applied to the surface of the aperture plate is carbon.

2. The electron gun according to claim 1, wherein the electron gun is a Schottky electron gun or a field emission electron gun.

3. The electron gun according to claim 1, wherein:
the extracting electrode is provided with an upper aperture plate and a lower aperture plate, the upper aperture plate being closer to the electron source than the lower aperture plate, and
a potential of the upper and lower aperture plates is made equal to a potential of the extracting electrode.

4. The electron gun according to claim 3, wherein in the upper and lower aperture plates provided on the extracting electrode, an inner diameter of an opening of the lower aperture plate is greater than an inner diameter of an opening of the upper aperture plate.

5. The electron gun according to claim 4, wherein:
the electron gun is a Schottky electron gun, and
a distance between the upper and lower aperture plates provided on the extracting electrode is one time the inner diameter of the opening of the lower aperture plate or more.

6. The electron gun according to claim 4, wherein:
the electron gun is a field emission electron gun, and
a distance between the upper and lower aperture plates provided on the extracting electrode is twice the inner diameter of the opening of the lower aperture plate or more.

7. A charged particle beam device comprising:
a main body including the electron gun according to claim 1;
a power supply configured to supply a voltage or an electric current for driving the main body; and
a controller configured to control the main body by controlling an output of the power supply.

8. The electron gun according to claim 1, wherein a thickness of the coating material is more than or equal to 50 nm.

9. The electron gun according to claim 8, wherein the thickness of the coating material is less than or equal to 500 nm.

10. The electron gun according to claim 8, wherein the thickness of the coating material is less than or equal to 200 nm.

11. The electron gun according to claim 1, wherein a thickness of the base material of the aperture plate is 10 to 50 nm.

* * * * *